United States Patent
Kehrer et al.

(10) Patent No.: US 8,351,496 B2
(45) Date of Patent: Jan. 8, 2013

(54) APPARATUS FOR FILTERING SIGNALS

(75) Inventors: Daniel Kehrer, Munich (DE); Franz Weiss, Munich (DE)

(73) Assignee: Qimonda AG, Munich (DE)

( * ) Notice: Subject to any disclaimer, the term of this patent is extended or adjusted under 35 U.S.C. 154(b) by 1053 days.

(21) Appl. No.: 11/760,450

(22) Filed: Jun. 8, 2007

(65) Prior Publication Data

US 2007/0286271 A1     Dec. 13, 2007

(30) Foreign Application Priority Data

Jun. 9, 2006  (DE) .......................... 10 2006 026 886

(51) Int. Cl.
  *H03H 7/30* (2006.01)
(52) U.S. Cl. ........................................ 375/234; 375/229
(58) Field of Classification Search ................... 375/229, 375/232, 234
  See application file for complete search history.

(56) References Cited

U.S. PATENT DOCUMENTS

| | | | |
|---|---|---|---|
| 4,215,418 A | * | 7/1980 | Muramatsu .................. 708/625 |
| 4,879,670 A | * | 11/1989 | Colarelli, III ................. 700/279 |
| 5,132,990 A | * | 7/1992 | Dukes .......................... 375/362 |
| 2002/0047730 A1 | * | 4/2002 | Ravatin et al. .................. 327/72 |
| 2004/0196085 A1 | * | 10/2004 | Shen .............................. 327/277 |
| 2006/0164275 A1 | * | 7/2006 | Fuchs et al. ................... 341/144 |

FOREIGN PATENT DOCUMENTS

| | | |
|---|---|---|
| DE | 2145404 | 6/1972 |
| WO | WO 2004023658 A1 * | 3/2004 |

OTHER PUBLICATIONS

"Sixth-order programmable bandwidth bandpass sigma-delta modulator implemented with transmission lines", L. Hermandez, et al., Electronics Letters, Dec. 9, 2004, vol. 40, No. 25.

"Approximation von Wirkungsfunktionen mit dem Orthogonalfilter", Peter Nagel, ntzArchiv Bd. 9 (1987) H. 8.

* cited by examiner

*Primary Examiner* — Khanh C Tran
*Assistant Examiner* — David Huang
(74) *Attorney, Agent, or Firm* — Dicke, Billig & Czaja, PLLC

(57) ABSTRACT

An integrated circuit having a filter apparatus for filtering a first symbol sequence is disclosed. The first symbol sequence has a predetermined symbol duration. The apparatus includes at least one delay device which is clocked in accordance with a clock, and configured to delay the first symbol sequence by a delay time. A relationship between the delay time of the delay device and a clock duration of the clocked delay device has a predetermined value which is not equal to the one.

25 Claims, 5 Drawing Sheets

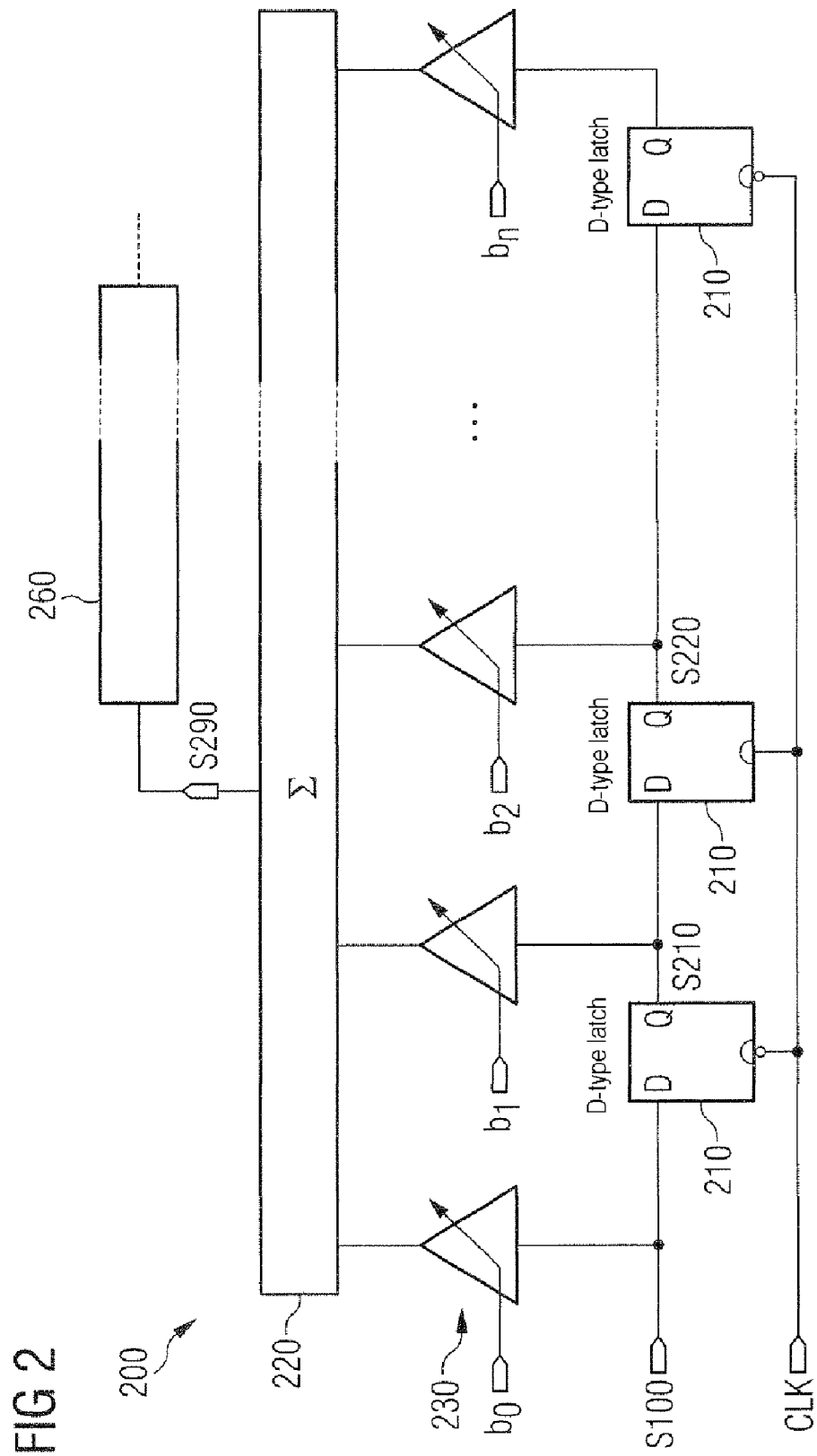

APPARATUS FOR FILTERING SIGNALS

CROSS-REFERENCE TO RELATED APPLICATIONS

This Utility patent application claims priority to German Patent Application No. DE 10 2006 026 886.5 filed on Jun. 9, 2006, which is incorporated herein by reference.

BACKGROUND

The present invention provides a filter apparatus, an integrated circuit having a filter apparatus, and devices implementing a filter apparatus.

FIG. 1a illustrates an FIR filter apparatus which can be used, for example, in the processing of digital signals. The input signal S100 can be supplied in the form of a symbol sequence x(t). The output signal S200 is generated after processing inside the filter apparatus. The output signal S200 likewise has the form of a symbol sequence y(t). The filter apparatus can be used, for example, in the processing of serial signals. A serial signal includes a sequence of concatenated symbols, each symbol having a symbol duration $T_0$. If the filter apparatus is clocked, the clock signal will have a clock frequency of $$f = \frac{1}{T_0}$$

in accordance with the conventional implementation (this corresponds to a full-rate system, but implementations where $$f = \frac{1}{2T_0}$$

may likewise be used, which corresponds to a half-rate implementation).

The conventional filter apparatus will be described in more detail below. The filter apparatus has a multiplicity of delay elements 150 and a multiplicity of filter coefficients b0, b1, b2. These filter coefficients b0, b1, b2 are the actual factors which are used to process the input signal.

This FIR filter apparatus can be implemented, for example, in a transmitter in order to predistort the transmission signal S100, for example. If this filter apparatus is intended to be used in a receiver, the filter is referred to as an "equalization filter". According to FIG. 1a, the FIR filter apparatus is illustrated in the form of a digital filter apparatus. The filter coefficients b0, b1 and b2 can be set using the transmission channel characteristics, for example. That is to say the FIR filter apparatus receives information relating to the quality of the transmission channel and the filter coefficients b0, b1, b2 are accordingly set using this information. The transmission channel is used to transmit the output sequence S200 to a receiver. The transmission channel is not illustrated in FIG. 1a.

The FIR filter apparatus also has an adder 190. This adder 190 is used to add the sequences S100, S110 and S120, which have been multiplied by the filter coefficients, in order to obtain the filtered output sequence S200.

In mathematical form, the transfer function of the FIR filter apparatus is thus:

$$H(z) = \frac{Y(z)}{X(z)} = b_0 + b_1 z + b_2 z^2 + \ldots + b_n z^n$$

The factor $b_n$ is intended to represent the fact that the FIR filter apparatus can contain a multiplicity of filter coefficients $b_0 \ldots b_n$. The power of the z factor is intended to represent the respective delay of the respective signal. For example, $z^2$ corresponds to a delay by two symbol lengths $T_0$. In this case, the mathematical representation of the transfer function H(z) corresponds to a representation in the complex variable domain and frequency domain.

According to this illustration, a latency of the FIR filter apparatus which corresponds to two symbol durations $T_0$ results. This latency results from the use of two delay devices 150. Each of these delay devices delays the signal S100 by one symbol duration or symbol length. The first delay device delays the signal S1100 and generates the signal S110. The signal S110 may be represented in a general form as $x(t-T_0)$. This signal S110 is then forwarded to the filter coefficient b1 and is accordingly multiplied by the latter. The signal S120 corresponds to the delay of the input signal S100 by two symbol durations. The signal S120 thus has the general form $x(t-2T_0)$. This signal S120 is then likewise forwarded to a corresponding filter coefficient b2 and is multiplied by the latter. The signals which have thus been multiplied are forwarded to the adder device 190 and are added in order to generate the output signal or the output sequence S200.

According to this illustration, the zeroth filter coefficient b0 receives the input signal S100 which has not been delayed.

FIG. 1b illustrates the frequency response of the conventional filter apparatus illustrated in FIG. 1a. The frequency response of the channel or the channel characteristics is/are likewise additionally diagrammatically illustrated. An FIR filter apparatus having four filter coefficients b0 to b3 was selected for this illustration.

The frequency in GHz is illustrated on the X axis of the illustration and the attenuation of the apparatus or of the channel in dB is illustrated on the Y axis. The channel characteristics C10 are diagrammatically illustrated and correspond to a diagrammatic illustration of data which are determined/measured in practice or using experiments. Therefore, it can be seen that the transmission channel has low-pass filter characteristics. The low frequencies are forwarded with little attenuation and, in contrast, the higher frequencies (above 5 GHz in this case) are heavily attenuated. The attenuation continues to increase as the frequency increases. Therefore, the filter apparatus inside the transmitter must accordingly amplify the higher frequencies so that the symbols can be transmitted via the transmission channel without distortion or errors. In order to achieve this, the filter apparatus illustrated in FIG. 1a can be dimensioned in such a manner that it has a frequency response in accordance with the frequency response illustrated in the curve C11. In this case, only two filter coefficients or taps are needed. In this design, the coefficient b1 corresponds to the negated coefficient b0 and the other remaining coefficients are set to be equal to 0. In the case of the curve C12, the second coefficient b2 is equated to the negated coefficient b0 and, in the case of the curve C13, the coefficient b3 is accordingly set in an analogous manner. These curves likewise correspond to frequency responses of the filter apparatus. This illustration can be used to diagrammatically read precisely the frequency response of the respective filter tap.

Delay times of $T_0=100$ ps are used in the FIR filter for this illustration. A clock frequency of the clocked delay devices of 10 GHz thus results. A data rate of 10 Gb/s consequently results. As mentioned above, it is necessary to compensate for the transmission characteristics C10 of the transmission channel. In this case, it is necessary to compensate for the low-pass filter behaviour of the transmission channel. This is achieved by setting the filter apparatus as a high-pass filter with the aid of the filter coefficients. The spectral components of the signal above 5 GHz must be amplified before being transmitted to the transmission channel. The frequency profile for $b_0=-b1$ performs this task up to 5 GHz. The other coefficient settings according to the curves C12 and C13 no longer have a pure high-pass filter behaviour in the relevant spectral range of the signal. The channel C10 can be sufficiently compensated for with a higher-order filter using positive and negative coefficients. This corresponds to greater circuit complexity and thus higher costs.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 2 illustrates an integrated circuit including a filter apparatus according to one embodiment.

DETAILED DESCRIPTION

Figure 1A:
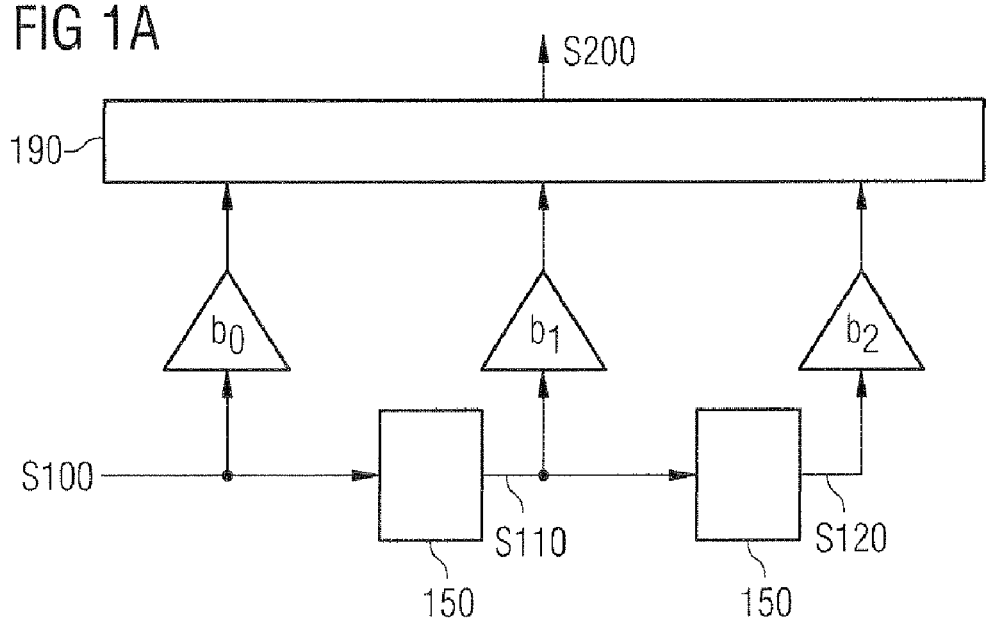
FIG. 1a illustrates a circuit diagram of a conventional FIR filter apparatus.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

FIG. 2 illustrates a diagram of an integrated circuit having a filter apparatus according to one embodiment. According to this embodiment, the filter apparatus is illustrated in the form of an FIR filter. The output signal is not iteratively returned. However, the present invention can likewise be applied to feedback filters (IIR, Infinite Impulse Response). That is to say, according to another embodiment, the apparatus from FIG. 2 may be in the form of an IIR filter apparatus.

The filter apparatus is in the form of a clocked filter apparatus which has a clock signal CLK. The clock signal CLK is correspondingly supplied to the clocked delay devices 210. The clocked delay devices 210 alternately receive the clock signal and the negated clock signal. Assuming synchronous data and clock signals, the first delay device 210 receives the non-negated clock signal. It is likewise conceivable for the delay device 210 to receive the negated clock signal in the case of given signal requirements.

As a result of the fact that the clock signal and the negated clock signal are alternately connected, the filter apparatus 200 can be operated on both edges of the clock signal, that is to say with the positive edge and the negative edge. According to this embodiment, the delay devices 210 are in the form of D-type latches having a delay time of $T_0/2$, that is to say half the symbol duration. Using half the symbol duration $T_0/2$ reduces the latency of the overall apparatus. The latency is halved in comparison with the conventional filter apparatus illustrated in FIG. 1a. The considerable reduction in the latency is very important in memory devices, for example. The advantage of the embodiment of this invention is also that the order of the FIR filter apparatus 200 remains the same. That is to say the number of coefficients and delay devices need not be changed in order to reduce the latency. The frequency $f_{CLK}$ of the clock signal corresponds to $1/T_0$. That is to say the overall frequency of the apparatus does not change even though the delay time of the delay devices 210 has been halved. This makes the apparatus compatible with earlier implementations.

During operation, the filter apparatus 200 receives an input signal S100 which corresponds to a sequence of symbols having the respective symbol duration $T_0$. The symbol sequence S100 is supplied, on the one hand, to the first delay device 210 and, according to this embodiment, is supplied to a filter coefficient 230 or the adapting device 230. The delay device 210 which is operated with the clock signal delays the input signal or the sequence S100 by $T_0/2$. In this case, the signal S100 is delayed with the aid of the delay device 210 and the output signal or delayed signal S210 is generated. In the mathematical form, the signal S210 corresponds to $x(T-T_0/2)$. The signal S220 is generated further along the delay chain. This signal corresponds to a delay by $T_0$ relative to S100 and is represented in the mathematical form as $x(T-T_0)$. Furthermore, the signal Sn is obtained after n delay devices 210. The signal Sn has the general form $x(T-N*T_0/2)$.

The output signals from the respective delay devices S210, S220 . . . Sn are accordingly forwarded to the adapting devices. These adapting devices 230 correspond to filter coefficients. These filter coefficients 230 can be set and are denoted $b_0$ to $b_n$ in FIG. 2. The value of the respective filter coefficients is set using the transmission characteristics of the transmission channel 260. These filter coefficients can be implemented in analogue or digital form. The task of the filter coefficients or the adapting devices $b_0$ to $b_n$ is to compensate for the transmission characteristics of the transmission channel. The delayed and adapted signals are combined with the aid of an adder 220 which generates the output sequence S290. The output sequence S290 has the mathematical form $b_0*S100+b_1*S210+b_2*S220+ \ldots +b_n*Sn$. This symbol sequence or output signal 290 is thus forwarded to the transmission channel in adapted form. According to FIG. 2, the adapting devices $b_0$ to $b_n$ are provided with the reference symbol 230.

According to another embodiment, the delay time of the delay devices 210 may have a predetermined value. This predetermined value can be adapted in accordance with the clock signal CLK. In another embodiment, the filter apparatus 200 includes a memory device (not illustrated in the drawing) which stores this value. The memory apparatus may likewise be set up to store the frequency value of the clock signal, channel characteristics of the transmission channel or symbol sequences. Values of the filter coefficients 230 may also be stored in the memory device. This implementation entails the advantage that the filter apparatus can be adapted using different clock signals.

The use of D-type latches 210 thus saves chip area since they can be implemented with fewer elements. In addition, the power requirement of the overall system can be reduced by using fewer elements.

Figure 3:
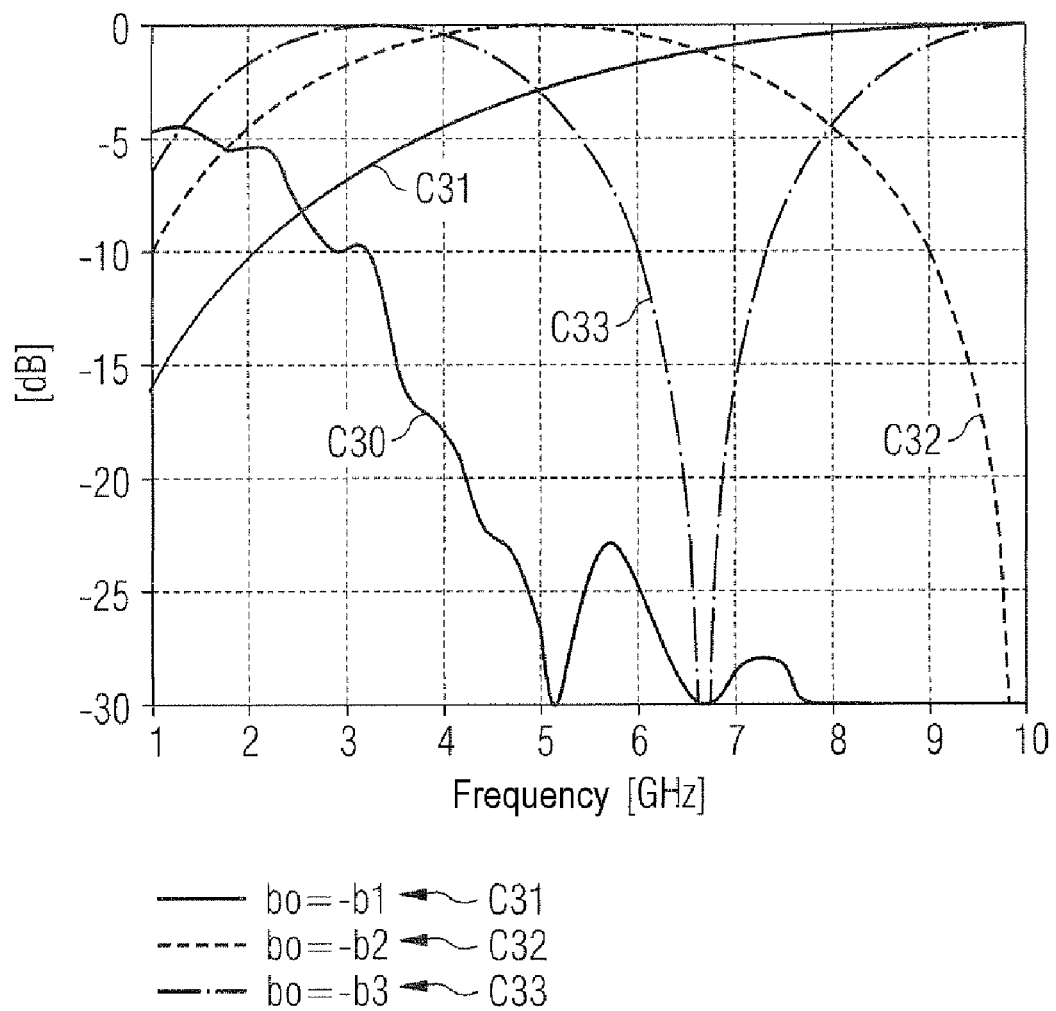
FIG. 3 illustrates the frequency response of the filter apparatus according to one embodiment and channel characteristics.

FIG. 3 illustrates the frequency response of the filter apparatus according to one embodiment. The diagram additionally contains the representation of the channel characteristics C30 of the transmission channel 260. A filter apparatus having four coefficients $b_0$ to $b_3$ was also used in this measurement. The values of the filter coefficients were set as described with reference to FIG. 1*b*.

Figure 1B:
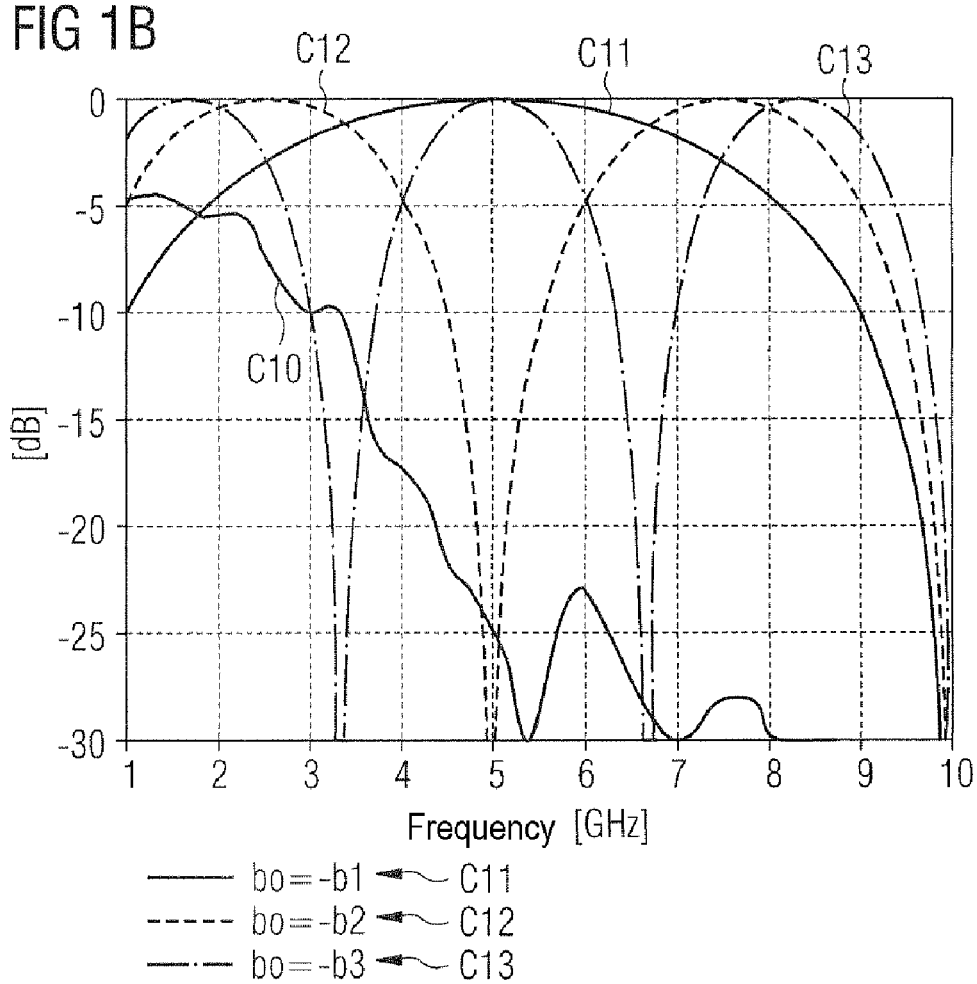
FIG. 1b illustrates the frequency response of conventional FIR filter apparatus and channel characteristics.

Therefore, it can be seen that the filter apparatus according to this embodiment has a better frequency response than the filter apparatus illustrated in FIG. 1*a*. The measured channel has the same channel characteristics. In order to compensate for these transmission characteristics of the channel C30, it is necessary to preprocess the input signal. This preprocessing can be carried out completely in accordance with the transfer function or the frequency response of the FIR apparatus from the curve C31. That is to say a better frequency range can be covered using only two coefficients, that is to say the filter order of the FIR filter corresponds to the value 2. Different frequency responses can be achieved by using other coefficient combinations. These frequency responses are represented by the curves C31 to C33. If only a pure high-pass filter behaviour is required, two coefficients $b_1$ and $b_2$ are sufficient to obtain the desired behaviour. When implemented, the circuit is implemented effectively in terms of circuitry and the high-pass filter contains only two D-type latches as delay devices, each having a delay time of $T_0/2$. The adder and the filter coefficients can be implemented in a conventional form. Accordingly, the radio-frequency spectral component of the transmission signal can be effectively increased using a filter with a latency of $T_0$.

Figure 4:
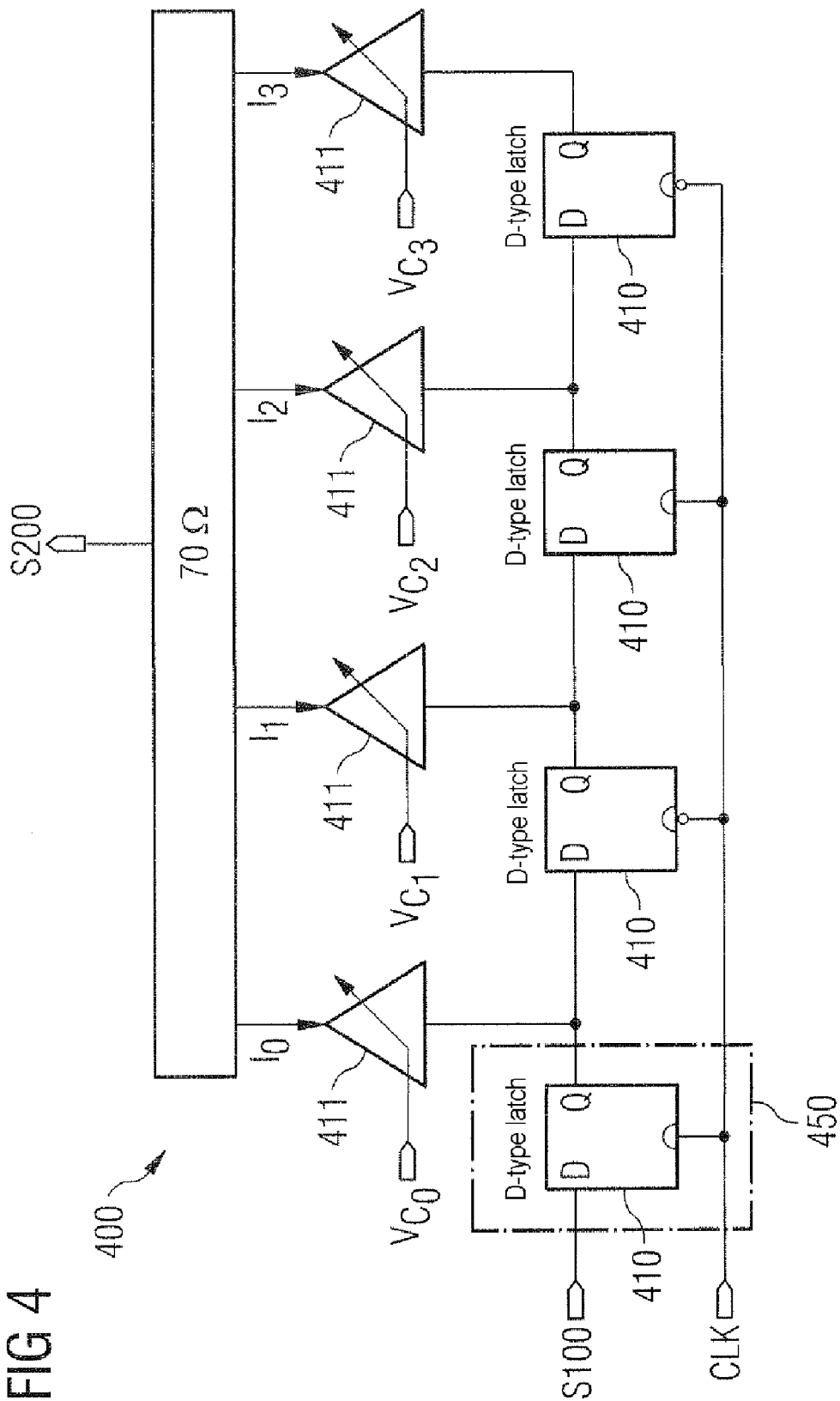
FIG. 4 illustrates a circuit diagram of one implementation of the FIR filter apparatus according to one embodiment.

FIG. 4 is a circuit diagram of one implementation of the FIR filter apparatus according to one embodiment. The FIR filter apparatus 400 likewise receives an input signal S100 in the form of a sequence of symbols and a clock signal CLK. Following processing, the filter apparatus 400 generates an output signal S200 which is likewise a symbol sequence. One or more embodiments illustrated here may be implemented in the form of a predistortion filter in a digital output driver. In this implementation, the circuit may be implemented using CMOS technology, for example. The logics of the circuit can be constructed on the basis of CML logics.

According to this embodiment, coefficient formation and the adder are implemented with the aid of an open-drain CML buffer which operates to a common load resistance. That is to say a voltage-current conversion is carried out and the currents are then added. The summation current flows away via the load resistance and is accordingly converted into a multiplicity of voltages.

The coefficients can thus be set using the current of the corresponding CML buffers. The currents are illustrated in FIG. 4 with the reference symbols $I_0$ to $I_3$.

The filter device 400 also has a synchronization device 450 which is used to synchronize the data signal and the clock signal CLK if no synchronous signals are available. According to this embodiment, the synchronization device is implemented in a similar manner to the delay devices 410. As a result, the symmetry of the circuit is still retained and there is no need for any complicated new developments. If a pure high-pass filter behaviour is desired, the last element in the delay chain of the delay devices 410 may be omitted. That is to say a powerful filter can be implemented with the aid of two delay devices 410 or D-type latches and three driver circuits or coefficients 411. The frequency response of the implementation according to one embodiment will be explained below.

Figure 5:
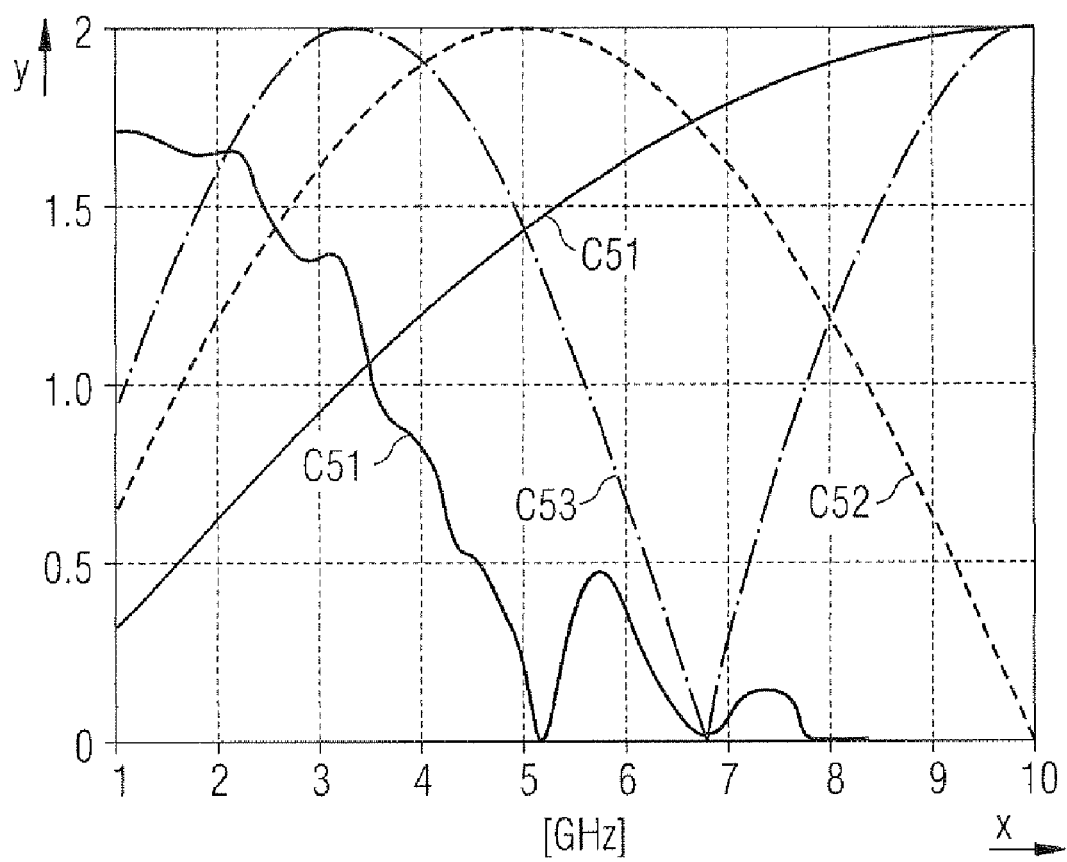
FIG. 5 illustrates the frequency response of the implemented FIR filter apparatus according to one embodiment.

FIG. 5 is the frequency response of the implemented FIR filter apparatus according to one embodiment. In contrast to the other measurement curves mentioned above, a standardized representation was selected on the Y axis in this case. In this illustration too, the frequency of the clock signal corresponds to 10 GHz. The currents through the respective adapting devices 411 are alternately set to be equal to $-I_0$. With a maximum data rate of 10 Gb/s at a clock frequency of 10 GHz, a frequency range of 0 to 5 GHz, which is to be taken into account, results. That is to say the attenuation of the channel C50 must be compensated for up to a frequency of 5 GHz. This can be gathered from FIG. 5. The transmission channel characteristics C50 are also diagrammatically represented in this illustration. The curve C51 is a second-order filter apparatus having two filter coefficients. As already mentioned, the filter coefficients 411 can be set with the aid of the currents $I_0$ to $I_3$. In the case of the curve C51, the current $I_1$ is equal to the negated current $I_0$, the other currents $I_2$ and $I_3$ being set to zero. This results in the behaviour of a differentiator over the entire signal spectrum with very good amplification of the radio-frequency components. The second setting, in which $I_2$ is equal to $-I_0$ and $I_1$ and $I_2$ correspond to zero, is illustrated in the curve C52. This instantaneous setting has a peak in the region of 5 GHz. A further setting which can be read using the curve C53 can be used to compensate for losses at low frequencies. FIG. 5 should illustrate the influence of the individual coefficients of the filter device.

The design of the invention is not restricted to the preferred exemplary embodiments specified above. Rather, a number of variants which also make use of the method according to the invention in other types of design are conceivable.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit having a filter apparatus for filtering a first symbol sequence, the first symbol sequence having a predetermined symbol duration, the apparatus comprising:

at least one delay device clocked in accordance with a clock and configured to respectively delay a first symbol sequence by a delay time;

at least one adapting device configured to receive the delayed first symbol sequence and to adapt the symbol sequence on the basis of filter coefficients, the at least one adapting device comprising a CML buffer for carrying out a voltage-current conversion of the delayed first symbol sequence where a filter coefficient is set using the current of the Current Mode Logic (CML) buffer; and where a relationship between the delay time of the delay device and a clock duration of the clocked delay device has a predetermined value which corresponds to a delay time which is half of the clock period, wherein the symbol duration of the first symbol sequence corresponds to the clock period of the clock signal of the clocked delay device.

2. The integrated circuit of claim 1, further comprising a memory device configured to store at least one of the following parameters: clock period and/or value of the relationship and/or delay time.

3. The integrated circuit of claim 1, the predetermined value being able to be stored in a memory device.

4. The integrated circuit of claim 1, comprising an adder to receive the adapted first symbol sequence and to generate a filtered symbol sequence.

5. The integrated circuit of claim 4, wherein the adder comprises a common load resistance.

6. The integrated circuit of claim 1, wherein the delay device is a clocked D-type latch.

7. The integrated circuit of claim 1, further comprising a device for synchronizing a data signal with the clock signal.

8. The integrated circuit of claim 7, wherein the device for synchronizing the data signal with the clock signal comprises a clocked D-type latch.

9. An apparatus including a circuit for filtering a first symbol sequence, the first symbol sequence having a predetermined symbol duration, the apparatus comprising:

a device for synchronizing a data signal with a clock signal;

at least one delay device clocked in accordance with the clock and configured to respectively delay the first symbol sequence by a delay time;

at least one adapting device configured to receive the delayed first symbol sequence and to adapt the symbol sequence on the basis of filter coefficients, the at least one adapting device comprising a Current Mode Logic (CML) buffer for carrying out a voltage-current conversion of the delayed first symbol sequence where a filter coefficient is set using the current of the CML buffer; and such that a relationship between the delay time of the delay device and a clock duration of the clocked delay device has a predetermined value which is not equal to one, wherein the device for synchronizing and the delay device each comprise a clocked D-type latch.

10. The apparatus of claim 9, wherein the value of the relationship corresponds to a delay time which is half of the clock period.

11. The apparatus of claim 9, wherein the symbol duration of the first symbol sequence corresponds to the clock period of the clock signal of the clocked delay device.

12. The apparatus of claim 9, wherein the predetermined value of the relationship between the delay time of the delay device and the clock period of the clocked delay device is adjustable.

13. The apparatus of claim 9, the apparatus also comprising a memory device configured to store at least one of the following parameters: clock period and/or value of the relationship and/or delay time.

14. The apparatus of claim 9, the predetermined value being able to be stored in a memory device.

15. The apparatus of claim 9, the apparatus comprising an adder to receive the adapted first symbol sequence and to generate a filtered symbol sequence.

16. The apparatus of claim 15, wherein the adder comprises a common load resistance.

17. The apparatus of claim 9, wherein the value of the relationship corresponds to a delay time which is half of the clock period, and wherein the symbol duration of the first symbol sequence corresponds to the clock period of the clock signal of the clocked delay device.

18. A method for operating an integrated circuit including filtering a first symbol sequence, the first symbol sequence having a predetermined symbol duration, the method comprising:

receiving the first symbol sequence;

receiving a clock signal having a predetermined clock period corresponding to the symbol duration of the first symbol sequence;

delaying the first symbol sequence by a delay time on the basis of the clock period of the received clock signal;

adapting the delayed symbol sequence on the basis of estimated filter coefficients via at least one Current Mode Logic (CML) buffer for carrying out a voltage-current conversion of the delayed symbol sequence where a filter coefficient is set using the current of the CML buffer; and the delay time and the clock period being in a predetermined relationship which is not equal to one, wherein the value of the relationship corresponds to a delay time of half of the clock period.

19. The method of claim 18, comprising determining the filter coefficients by estimating the characteristics of a transmission channel.

20. The method of claim 18, comprising:

adding the adapted symbol sequence to obtain a filtered output symbol sequence.

21. The method of claim 20, wherein adding the adapted symbol sequence comprises adding the adapted symbol sequence via a common load resistance.

22. The method of claim 18, further comprising:

synchronizing a data signal with the clock signal via a clocked D-type latch.

23. An apparatus comprising:

means for receiving a first symbol sequence;

means for receiving a clock signal having a predetermined clock period;

a clocked D-type latch configured to synchronize the first symbol sequence with the clock signal;

means for delaying the first symbol sequence by a delay time on the basis of the clock period of the received clock signal, the delay time and the clock duration being in a predetermined relationship which is not equal to one; and means for adapting the delayed symbol sequence on the basis of estimated filter coefficients via at least one Current Mode Logic (CML) buffer for carrying out a voltage-current conversion of the delayed symbol sequence where a filter coefficient is set using the current of the CML buffer.

24. The apparatus of claim 23, the apparatus further comprising means for estimating the filter coefficients on the basis of characteristics of a transmission channel.

25. The apparatus of claim 23, wherein the predetermined clock period corresponds to a symbol duration of the first symbol sequence, and wherein the delay time is half of the clock period.

* * * * *